United States Patent
Cox (10) Patent No.: US 8,486,242 B2
(45) Date of Patent: Jul. 16, 2013

(54) DEPOSITION APPARATUS AND METHODS TO REDUCE DEPOSITION ASYMMETRY

(75) Inventor: Michael S. Cox, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 12/906,632

(22) Filed: Oct. 18, 2010

(65) Prior Publication Data

US 2012/0090990 A1    Apr. 19, 2012

(51) Int. Cl.
*C23C 14/35* (2006.01)
*C23C 16/00* (2006.01)

(52) U.S. Cl.
USPC ............ 204/298.16; 204/298.06; 204/298.08; 204/298.11; 118/723 R; 118/723 E; 118/723 ER; 156/345.42; 156/345.46; 156/345.49

(58) Field of Classification Search
USPC ............. 204/298.06, 298.07, 298.08, 298.11, 204/298.16, 298.2; 118/723 R, 723 MW, 118/723 ME, 723 MA, 723 E, 723 ER, 723 I, 118/723 IR; 156/345.42, 345.46, 345.49
See application file for complete search history.

(56) References Cited

U.S. PATENT DOCUMENTS

| | | | | |
|---|---|---|---|---|
| 5,399,830 | A * | 3/1995 | Maruyama | 219/121.43 |
| 6,077,403 | A * | 6/2000 | Kobayashi et al. | 204/192.12 |
| 6,361,667 | B1 * | 3/2002 | Kobayashi et al. | 204/298.11 |
| 6,709,557 | B1 | 3/2004 | Kailasam et al. | |
| 6,753,689 | B1 | 6/2004 | Thomas | |
| 7,037,830 | B1 | 5/2006 | Rumer et al. | |
| 7,179,351 | B1 | 2/2007 | Juliano et al. | |
| 7,510,634 | B1 | 3/2009 | Klawuhn et al. | |
| 7,585,399 | B1 | 9/2009 | Lai et al. | |
| 7,892,405 | B1 | 2/2011 | Juliano et al. | |
| 7,922,880 | B1 | 4/2011 | Pradhan et al. | |
| 8,231,767 | B2 * | 7/2012 | Iori et al. | 204/298.16 |
| 2004/0060813 | A1 | 4/2004 | Chistyakov | |
| 2005/0274610 | A1 * | 12/2005 | Iseki | 204/298.2 |
| 2006/0066248 | A1 | 3/2006 | Chistyakov | |
| 2007/0085037 | A1 | 4/2007 | Chang et al. | |

FOREIGN PATENT DOCUMENTS

WO    WO 2009/157186    * 12/2009

* cited by examiner

*Primary Examiner* — Rodney McDonald
(74) *Attorney, Agent, or Firm* — Sevilla Whitney LLC (57) ABSTRACT

One or more embodiments of the invention are directed to deposition apparatuses comprising a grounded top wall, a processing chamber and a plasma source assembly having a conductive hollow cylinder and a magnet outside the conductive hollow cylinder capable of affecting the current density on the conductive hollow cylinder.

13 Claims, 5 Drawing Sheets

DEPOSITION APPARATUS AND METHODS TO REDUCE DEPOSITION ASYMMETRY

BACKGROUND

Embodiments of the invention generally relate to deposition apparatus and methods of use. More specifically, embodiments of the invention relate to deposition apparatus which include a continuous grounded shield positioned outside a plasma source assembly.

Various deposition processes, including physical vapor deposition (PVD) and chemical vapor deposition (CVD) are used to deposit metal films such as copper onto semiconductor wafers to form electrical interconnections. In some PVD processes, a high level of D.C. power is applied to a metal target overlying the wafer in the presence of a carrier gas, such as argon. PVD processes typically rely upon a very narrow angular distribution of ion velocity to deposit metal onto sidewalls and floors of high aspect ratio openings in the wafer. The deposition of sufficient material on the sidewalls relative to the amount deposited on the floors of the openings presents a problem. Another problem pertains to avoiding pinch-off of the opening due to faster deposition near the top edge of the opening. As miniaturization of feature sizes has progressed, the aspect ratio (depth/width) of a typical opening has increased, with microelectronic feature sizes having now been reduced to about 22 nanometers. With greater miniaturization, it has become more difficult to achieve minimum deposition thickness on the sidewall for a given deposition thickness on the floor or bottom of each opening.

The increased aspect ratio of the typical opening has been addressed by further narrowing of the ion velocity angular distribution, by increasing the wafer-to-sputter target distance (e.g., to 300 mm or more) and reducing the chamber pressure (e.g., to less than 1 mT). This has given rise to a problem observed in thin film features near the edge of the wafer: At extremely small feature sizes, a portion of each high aspect ratio opening sidewall is shadowed from a major portion of the target because of the greater wafer-to-target gap required to meet the decreasing feature size. This shadowing effect, most pronounced near the wafer edge, makes it difficult if not impossible to reach a minimum deposition thickness on the shadowed portion of the side wall. With further miniaturization, it has seemed a further decrease in chamber pressure (e.g., below 1 mT) and a further increase in wafer-sputter target gap would be required, which would exacerbate the foregoing problems.

Current RF and VHF capacitive source designs utilize asymmetric feed designs. It has been seen that asymmetry of the feed design leads to asymmetry of the electric field at the target surface. This asymmetry at the target or powered electrode invariably results in asymmetry of the deposition or etching of the wafer. Controlling aspect ratios of the feed design is insufficient to negate the asymmetry. The asymmetry, also referred to as "skew", can become a controlling factor. Therefore, there is a need in the art for systems and methods to mitigate the skew.

SUMMARY

One or more embodiments of the invention are directed to a processing apparatus. The apparatus comprises a processing chamber with a plasma source assembly on the processing chamber. The plasma source assembly comprises a conductive hollow cylinder and at least one power source connected to the conductive hollow cylinder and adapted to cause a current density on the conductive hollow cylinder. At least one magnet is outside the conductive hollow cylinder. In detailed embodiments, the at least one magnet is positioned to affect the current density on the conductive hollow cylinder. In specific embodiments, the at least one magnet increases the uniformity of the current density. In exemplary embodiments, the current density on the conductive hollow cylinder has a more uniform distribution than the current density in a similar apparatus without the at least one magnet.

According to various embodiments, the apparatus is a physical vapor deposition chamber or a chemical vapor deposition chamber.

In some embodiments, the at least one power source comprises an RF power source and a DC power source connected to opposite sides of the conductive hollow cylinder. In detailed embodiments, the at least one power source is connected to the conductive hollow cylinder off axis.

The processing chamber of some embodiments, further comprises a processing region defined by a pedestal, a sputter target and a cylindrical skirt having a radius that encompasses the sputter target and the pedestal. In detailed embodiments, the apparatus further comprises a process gas source connected to a gas distribution ring in the chamber through a mass flow controller. In specific embodiments, the conductive hollow cylinder further comprises a plurality of holes spaced to allow a uniform flow of gas from the conductive hollow cylinder to the processing chamber.

In some embodiments, the plasma source assembly further comprises a magnetron assembly including a magnetron magnet supported on a radial arm and an axial spindle supporting the radial arm. In detailed embodiments, the axial spindle is connected to an actuator adapted to rotate the axial spindle along an axis causing the magnetron magnet supported on the radial arm to be rotated about the axial spindle. In specific embodiments, the axial spindle is made from a dielectric material having a dielectric constant less than about 10.

Additional embodiments of the deposition apparatus comprise a processing chamber, a conductive pedestal with an internal electrode, at least one power source connected to the internal electrode of the conductive pedestal and adapted to generate an electric field to create a current density on the conductive pedestal. At least one magnet is located outside the pedestal. In detailed embodiments, the current density on the conductive pedestal is more uniform than in a similar apparatus without the at least one magnet outside the pedestal.

Some embodiments further comprise a controllable DC voltage source connected to the internal electrode of the conductive pedestal. Detailed embodiments, further comprise a low frequency RF bias power generator connected through an RF impedance match to the internal electrode of the conductive pedestal.

Further embodiments of the invention are directed to methods of processing a substrate in a processing chamber comprising a pedestal and a plasma source assembly having a conductive hollow cylinder. A substrate is disposed on the pedestal. A current density is created on one or more of the conductive hollow cylinder and the pedestal. The current density is altered with at least one magnet. Detailed embodiments further comprise moving the at least one magnet to increase the uniformity of the current density.

In some embodiments, the current density is created on the conductive hollow cylinder and the at least one magnet is positioned outside the conductive hollow cylinder. In various embodiments, the current density is created on the pedestal and the at least one magnet is positioned adjacent the pedestal.

In detailed embodiments, a plasma is ignited within the processing chamber. In specific embodiments, the plasma has a more uniform density than in a processing chamber with the at least one magnet positioned to alter the current density.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the terms "VHF" and "RF" are used interchangeably. In common usage, the term "RF" is used to describe frequencies less than about 30 MHz and the term "VHF" is used to describe frequencies greater than about 30 MHz. It should be understood that the various embodiments of the invention are not limited to either VHF or RF frequencies and this should not be taken as limiting the scope of the embodiments. It has been observed that higher frequency results in higher plasma density. As the frequency increases above about 27 MHz there is a dramatic increase in plasma asymmetry. As higher frequencies are often desired, the field asymmetry becomes a greater issue.

Distribution of RF and VHF current has a direct effect on plasma density in wafer processing chambers that rely on capacitive coupling to generate deposition and etch plasmas. When chamber dimensions exceed ⅛ wavelength of the frequency used, or a similarly dimensioned conductive distribution path leads to the processing chamber, current density on biased electrodes becomes non-uniform.

In many cases, the "feed" path for RF/VHF cannot be placed such that there is radial symmetry, i.e., in the center of a symmetric assembly. In some cases, this may be because of interference with other assembly components, while in other cases the chamber itself may not be radially symmetric, as in the case of glass-solar panel substrate processing.

It has been discovered in the development of a VHF source for PVD applications that the spread of current density around the feed path to the PVD target material is asymmetric due to an off-center connection to the VHF power supply. In testing to determine a means to correct this issue, while maintaining the off-center position of the feed, a magnetized component was found to have an effect on the plasma density uniformity. Further purposeful testing has shown that a DC magnetic field, applied to the feed path of the VHF power far from the plasma, can alter the plasma density via an alteration of the current density in the conductor comprising the feed path.

It has been found that permanent magnets positioned far from the processing chamber can be used to purposefully shape the distribution of RF/VHF energy on a biased chamber electrode, and hence the plasma itself. This effect can be utilized in any situation where wavelength transmission effects are affecting the plasma. Embodiments of the invention may be particularly effective for large substrate applications where RF/VHF distribution is a significant limitation to processing large substrate with high frequency, high density plasmas. Additionally, issued caused by inadvertently applied magnetic fields to RF/VHF conductors can be identified, and shielding designed, to eliminate the issue. In this manner, "stray" fields caused by other chamber components can be eliminated and uniformity of deposition or etch improved.

It has been found that reduced wafer-target gaps in PVD render the processes vulnerable to asymmetries in the distribution of RF power to the target. In particular, the RF power must be applied to an overhead structure (e.g., the ceiling) above the sputter target at an off-axis connection because the center axis is occupied by the magnetron rotation apparatus. Each time the rotating magnet of the magnetron assembly passes under the off-axis RF power connection, RF coupling to the plasma is briefly enhanced, while plasma conditions (e.g., plasma load impedance presented to the VHF power) are changed. D.C. power, which may be connected at another off-axis location above the target, is affected by these changes. These fluctuations occur with each rotation of the magnet past the off-axis RF power connection. While such fluctuations have not been a problem in conventional reactors having large wafer-to-target gaps (e.g., 300 mm), with very small wafer-target gaps (e.g., 5 cm) such fluctuations are closely coupled to the wafer.

One symptom of the foregoing is an azimuthal pattern of non-uniform deposition on the wafer surface that reflects the off-axis locations of the RF power and DC power connections over the target. In one example, the deviation between minimum and maximum deposition film thickness in the azimuthal direction was 26%. Another symptom is plasma instability or fluctuations in plasma impedance that the VHF impedance match cannot follow at higher chamber pressures, leading to a loss of process control and in some cases automatic shut-down of the VHF generator. Another symptom is penetration of the plasma beneath the wafer support pedestal and damage to unprotected components there, leading to contamination. The impedance fluctuations reduce the range of usable chamber pressures below the desired pressure. A related problem is that if the DC power level is reduced, the fluctuations in plasma conditions caused by passage of the magnet beneath the RF connection over the target (e.g., sudden reductions in voltage) cause automatic anti-arcing features in the DC power supply to shut down the DC power supply. A similar effect can occur with the VHF generator, so that either or both the DC power and the RF power may flicker with each rotation of the magnet. These problems have made it difficult to perform a workable process at high chamber pressures (e.g., 100 mT).

Figure 1:
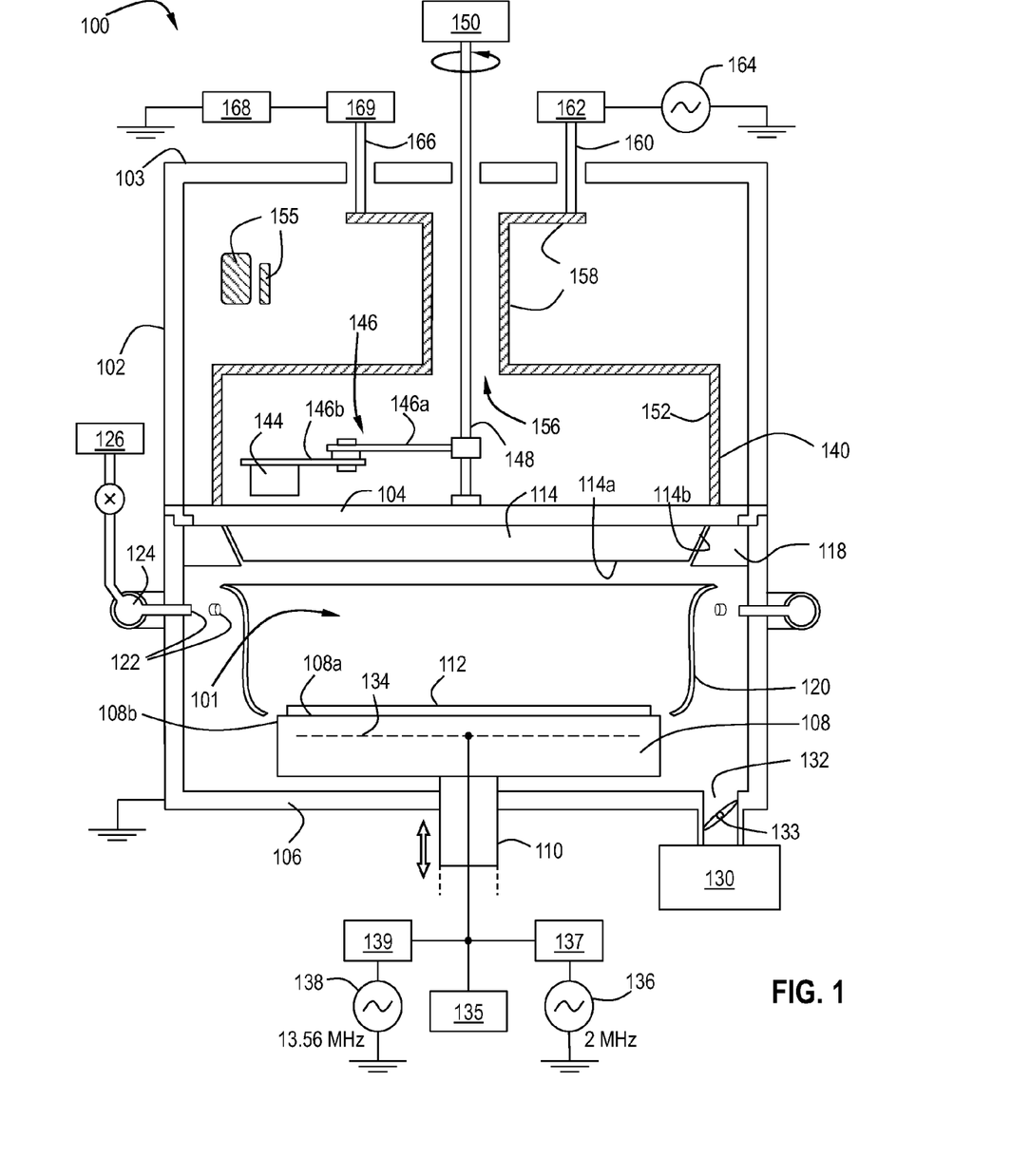
FIG. 1 shows a simplified elevational view of a physical vapor deposition apparatus in accordance with one or more embodiments of the invention.

FIG. 1 illustrates a physical vapor deposition (PVD) apparatus 100 according to one or more embodiments of the invention. While a physical vapor deposition chamber is shown, it should be understood, and it is shown in later figures, that the apparatus could be a chemical vapor deposition chamber. The PVD apparatus 100 shown is suitable for carrying out plasma-enhanced physical vapor deposition on a workpiece such as a semiconductor wafer. The PVD apparatus 100 shown has a cylindrical grounded side wall 102 and a grounded top wall 103. A processing chamber 100, or vacuum chamber, is enclosed by a cylindrical side wall 102, a ceiling 104 and a floor 106. As used in this specification and the appended claims, the term "cylindrical" is not limited to a right circular cylinder, but can also include, for example, elliptical cylinders, irregular cylinders, extruded ovals and extruded rectangular and square shapes. Essentially, the term "cylindrical" is used to describe the shape of any suitable processing chamber 100 and is not limited to specific shapes.

A workpiece support pedestal 108 within the processing chamber 100 is held on a lift assembly 110 within the processing chamber 100 and has a workpiece support surface 108a facing the ceiling 104. A workpiece such as a semiconductor wafer 112 may be held on the support surface 108a. A sputter target 114 is held at the interior surface of the ceiling 104 and has a main surface 114a facing the support surface 108a of the pedestal 108. A process region 101 is defined between the support surface 108a and the target main surface 114a. An annular ceramic spacer 118 surrounds a side edge 114b of the sputter target 114. An annular confinement skirt 120 surrounding the process region 101 extends axially from the ceramic spacer 118 to the top peripheral edge 108b of the support pedestal 108. Gas injection nozzles 122 extending through the side wall 102 at spaced-apart locations are coupled to a hollow gas distribution ring 124. A process gas source 126 furnishes a process gas to the gas distribution ring 124 through a mass flow controller or valve 128. A vacuum pump 130 is coupled to the chamber 100 through a passage 132 through the bottom wall 106. A vacuum control valve 133 controls the chamber pressure. In specific embodiments, the target 114 is selected from the group consisting of silicon, doped silicon, zinc oxide, indium tin oxide, transparent conductive oxide, metals, copper indium gallium diselenide (CIGS) and combinations thereof.

The wafer support pedestal 108 may include an internal electrode 134. If the pedestal 108 embodies an electrostatic chuck, then a controllable D.C. voltage source 135 may be connected to the pedestal internal electrode 134. In order to control ion energy at the surface of the wafer 112, a low frequency RF bias power generator 136 may be connected through an RF impedance match 137 to the electrode 134. In addition, an intermediate or high frequency RF bias power generator 138 may be connected through an impedance match 139 to the electrode 134.

A plasma source assembly 142 overlying the ceiling 104 contains a conductive hollow cylinder 140. The plasma source assembly 142 shown includes a magnet 144 supported on a radial arm 146 and an axial spindle 148 supporting the arm 146. The radial arm 146 has separately articulating arm sections 146a, 146b. A rotation actuator 150 rotates the spindle 148, causing the magnet 144 to perform an orbital rotational motion over the ceiling 104. The conductive hollow cylinder 140 includes an enclosure side wall 152 and an enclosure lid 154. The lid has a central circular opening 156 through which the spindle 148 extends between the radial arm 146 and the rotation actuator 150 external of the conductive hollow cylinder 140. In detailed embodiments, the axial spindle 148 is made of a dielectric material. In specific embodiments, the dielectric constant of the material is less than about 10. In various embodiments, the dielectric constant is less than about 9, 8, 7, 6, 5, 4, 3 or 2.

In some embodiments, the dielectric constant is less than about 8. In one or more embodiments, the dielectric constant is about 4.

The problem of plasma fluctuations arises upon application of RF source power to the target 114 by coupling the source power to an off-axis point on the chamber ceiling 104 or an off-axis point on the housing lid (as two possible examples). The RF power distribution is necessarily concentrated at the point of application, leading to an azimuthally non-uniform RF power distribution. As the magnet 144 passes through a point of rotation in alignment with the point of RF power application, power coupling to the plasma temporarily peaks, leading to the process fluctuations discussed.

In order to avoid such an asymmetrical distribution of RF power, an RF Feed system includes a symmetrical conductor concentric with the axis of symmetry provided on top of the conductive hollow cylinder 140, for application of RF and DC power to the target 114. Specifically, a conductive hollow cylinder extension 158 surrounding the spindle 148 extends from the edge of the circular opening 156 away from the conductive hollow cylinder 140. At least one power source is connected to the conductive hollow cylinder 140. The at least one power source is adapted to cause a current density on the conductive hollow cylinder 140. The power sources shown in the embodiment of FIG. 1 include an RF power generator 164 and a DC power source 168. An RF connection rod 160 extends outwardly from the hollow cylinder extension 158. An RF impedance match 162 is coupled to the outer end of the RF connection rod 160. An RF power generator 164 is coupled to the RF impedance match 162. A DC connection rod 166 extends radially outwardly from the hollow cylinder extension 158 in a direction opposite to that of the RF connection rod 160. A DC power source 168 is coupled to the outer end of the DC connection rod 166. The DC connection rod 166 may be connected to an RF blocking filter 169 of the DC power supply 168. FIG. 1 shows the RF and DC connections on opposite sides of the conductive hollow cylinder. This arrangement is merely illustrative and should not be taken as limiting the scope of the invention. Suitable arrangements include, but are not limited to, a single DC or RF source, dual sources on the same side, dual sources on opposite sides, dual sources located at points forming an angle of less than 180° relative to the central of the conductive hollow cylinder, and dual sources where one is located centrally and the other is offset.

At least one magnet 155 is located outside the conductive hollow cylinder 140 and is positioned to affect the current density on the conductive hollow cylinder 140. FIG. 1 shows embodiments of the invention having two magnets 155 with different sizes. The size, shape and strength of the magnets can be adjusted depending on the desired effect on the current density on the conductive hollow cylinder 140 and the plasma uniformity. In specific embodiments, the at least one magnet 155 is positioned to increase the uniformity of the current density on the conductive hollow cylinder 140. Tuning the uniformity of the current density may require several magnets of various sizes positioned at various locations outside the conductive hollow cylinder 140. Determining specific locations and magnet sizes can be accomplished by, for example, theoretical mapping of the current density or through a trial-and-error approach.

The magnets 155 can be made from any suitable material and can be permanent magnets or electromagnets. The magnetic field strength and density of the magnetic field of the magnets can vary depending on the desired effect on the charge density. When permanent magnets are used, the magnet may have a high resistance to becoming demagnetized. In specific embodiments, the magnets are rare earth magnets.

The hollow cylinder extension 158, the connection rods 160, 166, the conductive hollow cylinder 140 and the ceiling 104 are formed of a non-magnetic conductive material, such as aluminum for example. The connection rods 160, 166 pass through the grounded top wall 103 of the processing chamber 100 and connect to the conductive hollow cylinder 140. The connection rods 160, 166 and the conductive hollow cylinder 140 may be formed of copper, to provide a highly conductive current path. RF current from the generator 164 flows in a circular manner around the hollow cylinder extension 158 for uniform distribution around the circumference of the conductive hollow cylinder 140 and uniform application to the target 114. DC current from the DC power source 168 flows in a circular manner around the hollow cylinder extension 158 for uniform distribution around the circumference of the conductive hollow cylinder 140 and uniform application to the target 114. The target 114 is typically a metallic species that is to be deposited onto the workpiece, or wafer 112.

Figure 2:
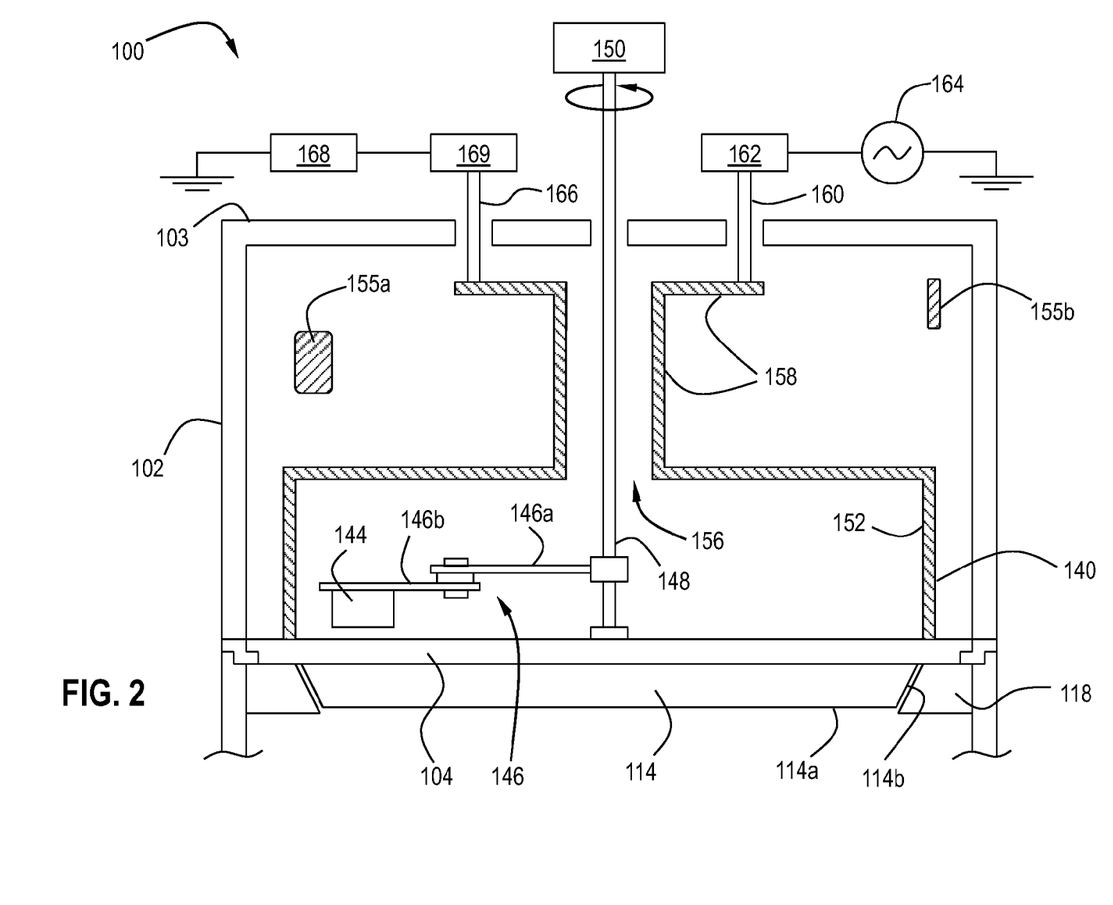
FIG. 2 shows an enlarged detailed view of one embodiments of the upper housing in the reactor of FIG. 1.
Figure 3:
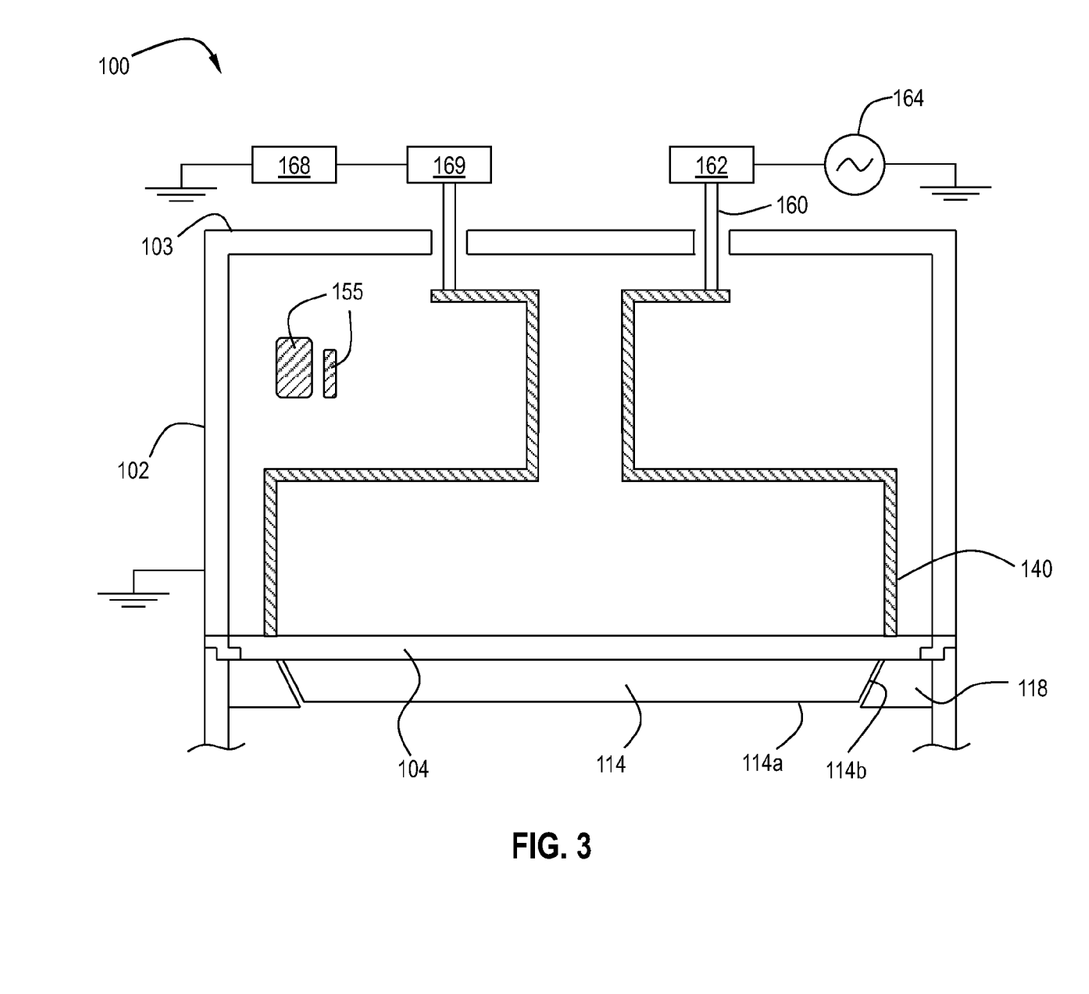
FIG. 3 shows an enlarged detailed view of one or more embodiments of the upper housing in the reactor of FIG. 1.

FIG. 2 is an enlarged view of an apparatus according to one or more embodiments of the invention. Two different magnets 155a, 155b are positioned at different locations. The magnets 155 are different sizes and different distances away from the conductive hollow cylinder 140. The placement of these magnets 155 can be adjusted based on the uniformity of the current density observed. FIG. 3 shows an embodiment of a deposition chamber similar to that of FIG. 1 but without the rotating magnet assembly (i.e., a magnet 144 supported by radial arms 146).

Figure 4:
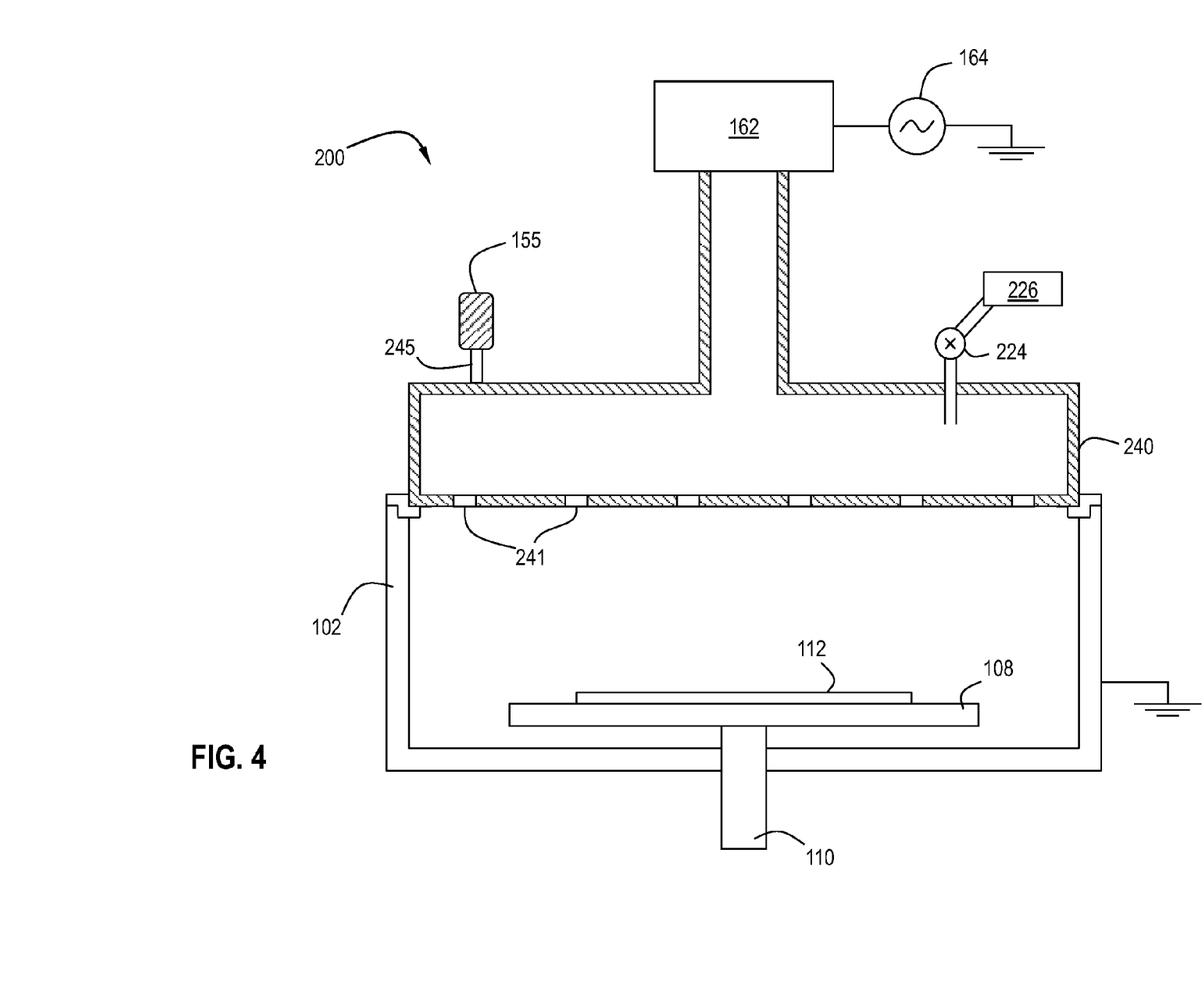
FIG. 4 shows a chemical vapor deposition apparatus in accordance with one more embodiments of the invention.

FIG. 4 shows an embodiment of a chemical vapor deposition apparatus 200 in accordance with one or more embodiments of the invention. The apparatus 200 includes similar components to those previously described with the conductive hollow cylinder replaced with a conductive hollow cylinder 240 having a series of holes 241 spaced to allow a uniform flow of gas from the conductive hollow cylinder 240. It will be appreciated that FIG. 4 shows a cross-sectional view so that there are a plurality of holes 241 spaced throughout the bottom of the conductive hollow cylinder 240 adjacent the processing region. The holes 241 are small enough so as to not interfere with the conduction of power from the RF impedance match 162. A gas inlet 226 feeds a processing gas into the conductive hollow cylinder 240 and may include a metering device 224 for controlling the pressure of the processing gas in the apparatus 200.

The magnet 155 in FIG. 4 is shown positioned on a magnet support 245. This is merely illustrative and should not be taken as limiting the scope of the invention. The magnet 155 can be attached to the conductive hollow cylinder 240, the side wall 102, the top wall 103, or other suitable structure. The magnet support 245 can be made from a magnetic or non-magnetic material.

Figure 5:
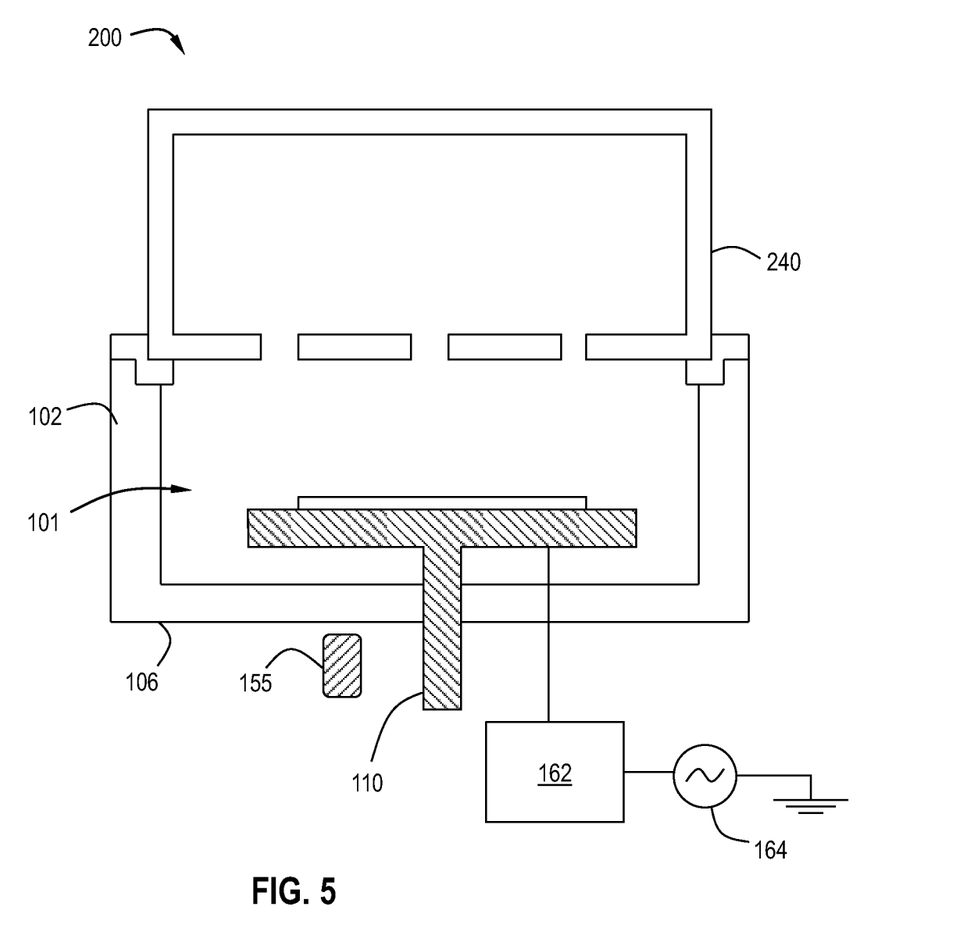
FIG. 5 shows a chemical vapor deposition apparatus in accordance with one or more embodiments of the invention.

FIG. 5 shows another apparatus 200 in accordance with various embodiments of the invention. The apparatus 200 shown in FIG. 5 is a CVD apparatus but can be a PVD apparatus like that of FIG. 1. The deposition apparatus 200 has a grounded side wall 102 and a grounded bottom wall 106. A processing chamber 100 is bounded by the grounded side wall 102 and the grounded bottom wall 106. The processing chamber 100 has a processing region defined as space above a conductive pedestal 108. The conductive pedestal 108 is positioned adjacent the grounded bottom wall 106 of the apparatus 200. An RF impedance match 162 is connected to the pedestal 108, which in some embodiments has an internal electrode 134, as shown in FIG. 1, and is adapted to cause a current density on the pedestal 108. A magnet 155 is placed outside the pedestal 108 (or multiple magnets are placed around the pedestal) and is positioned to increase the uniformity of the current density on the pedestal 108. This configuration provides the same asymmetry benefits as the embodiments described with respect to FIGS. 1 through 4. In specific embodiments, both the pedestal 108 and the conductive hollow cylinder 140 have at least one magnet 155 positioned outside. This results in greater electric symmetry in the apparatus.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A processing apparatus comprising:
a processing chamber;
a plasma source assembly on the processing chamber, the plasma source assembly comprising a conductive hollow cylinder and at least one power source comprising one or more of an RF power source and a DC power source connected to the conductive hollow cylinder to cause an asymmetrical current density on the conductive hollow cylinder and generate a plasma; and
at least one magnet outside the conductive hollow cylinder, the at least one magnet positioned to increase symmetry in the asymmetrical current density and uniformity of the plasma.

2. The apparatus of claim 1, wherein the at least one power source is connected to the conductive hollow cylinder off axis.

3. The apparatus of claim 1, wherein the apparatus is a physical vapor deposition chamber.

4. The apparatus of claim 1, wherein the apparatus is a chemical vapor deposition chamber.

5. The apparatus of claim 1, wherein the at least one power source comprises an RF power source and a DC power source connected to opposite sides of the conductive hollow cylinder.

6. The apparatus of claim 1, wherein the processing chamber further comprises a processing region defined by a pedestal, a sputter target and a cylindrical skirt having a radius that encompasses the sputter target and the pedestal.

7. The apparatus of claim 1, wherein the plasma source assembly further comprises a magnetron assembly including a magnetron magnet supported on a radial arm and an axial spindle supporting the radial arm.

8. The apparatus of claim 7, wherein the axial spindle is connected to an actuator to rotate the axial spindle along an axis causing the magnetron magnet supported on the radial arm to be rotated about the axial spindle.

9. The apparatus of claim 7, wherein the axial spindle is made from a dielectric material having a dielectric constant less than about 10.

10. The apparatus of claim 1, wherein the current density on the conductive hollow cylinder has a more uniform distribution than the current density in a similar apparatus without the at least one magnet.

11. The apparatus of claim 1, further comprising a process gas source connected to a gas distribution ring in the processing chamber through a mass flow controller.

12. The apparatus of claim 1, wherein the conductive hollow cylinder further comprises a plurality of holes spaced to allow a uniform flow of gas from the conductive hollow cylinder to the processing chamber.

13. A processing apparatus comprising:
a processing chamber having a processing region defined by a pedestal, a sputter target and a cylindrical skirt;
a plasma source assembly on the processing chamber, the plasma source assembly including a conductive hollow cylinder, at least one power source connected off axis to the conductive hollow cylinder, the power source causing an asymmetric current density on the conductive hollow cylinder, and a magnetron assembly within the conductive hollow cylinder, the magnetron assembly comprising a magnetron magnet supported on a radial arm and an axial spindle supporting the radial arm, the axial spindle connected to an actuator to rotate the axial spindle along an axis causing the magnetron magnet supported on the radial arm to be rotated about the axial spindle; and
at least one magnet positioned outside the conductive hollow cylinder, the at least one magnet positioned to increase the symmetry of the asymmetric current density on the conductive hollow cylinder.

* * * * *